(12) United States Patent
Harada et al.

(10) Patent No.: US 10,014,294 B2
(45) Date of Patent: Jul. 3, 2018

(54) SEMICONDUCTOR INTEGRATED CIRCUIT DEVICE HAVING ENHANCEMENT TYPE NMOS AND DEPRESSION TYPE MOS WITH N-TYPE CHANNEL IMPURITY REGION AND P-TYPE IMPURITY LAYER UNDER N-TYPE CHANNEL IMPURITY REGION

(71) Applicant: SII Semiconductor Corporation, Chiba-shi, Chiba (JP)

(72) Inventors: Hirofumi Harada, Chiba (JP); Masayuki Hashitani, Chiba (JP)

(73) Assignee: ABLIC Inc. (JP)

( * ) Notice: Subject to any disclaimer, the term of this patent is extended or adjusted under 35 U.S.C. 154(b) by 0 days.

(21) Appl. No.: 15/247,144

(22) Filed: Aug. 25, 2016

(65) Prior Publication Data

US 2016/0372465 A1    Dec. 22, 2016

Related U.S. Application Data

(62) Division of application No. 14/033,842, filed on Sep. 23, 2013, now abandoned.

(30) Foreign Application Priority Data

Sep. 27, 2012    (JP) .................... 2012-215034

(51) Int. Cl.
    *H01L 27/088*    (2006.01)
    *H01L 27/092*    (2006.01)
    *H01L 29/06*    (2006.01)
    *H01L 29/78*    (2006.01)

(52) U.S. Cl.
    CPC ........ *H01L 27/0883* (2013.01); *H01L 27/092* (2013.01); *H01L 29/0615* (2013.01); *H01L 29/7833* (2013.01)

(58) Field of Classification Search
    CPC ...................................... H01L 27/092
    See application file for complete search history.

(56) References Cited

U.S. PATENT DOCUMENTS

| 6,469,347 B1 | 10/2002 | Oda et al. ............... 257/345 |
| 6,653,694 B1 * | 11/2003 | Osanai ............. H01L 27/0883 257/392 |
| 7,208,383 B1 * | 4/2007 | Weintraub ........ H01L 21/26586 257/E21.345 |

(Continued)

FOREIGN PATENT DOCUMENTS

JP    2003152099 A    *    5/2003

OTHER PUBLICATIONS

JP 2003-152099, Machine translation from the European Patent Office (EPO) created on Oct. 13, 2016, European Patent Office, pp. 1-9.*

(Continued)

*Primary Examiner* — Olik Chaudhuri
*Assistant Examiner* — Lamont Koo
(74) *Attorney, Agent, or Firm* — Adams & Wilks

(57) ABSTRACT

Provided is a constant voltage circuit having a stable output voltage. In a constant voltage circuit formed by connecting an enhancement type NMOS and a depression type NMOS in series, in order to enhance the back bias effect of the depression type NMOS, the impurity concentration is set to be high only in a P-type well region on which the depression type NMOS is arranged.

2 Claims, 10 Drawing Sheets

(56) References Cited

U.S. PATENT DOCUMENTS

| | | | |
|---|---|---|---|
| 2002/0113642 A1 | 8/2002 | Ikeda | 327/540 |
| 2008/0297132 A1 | 12/2008 | Aota | 323/313 |
| 2009/0045870 A1 | 2/2009 | Imura | 327/543 |
| 2011/0079861 A1 | 4/2011 | Shifren et al. | 257/402 |
| 2011/0147712 A1 | 6/2011 | Radosavljevic et al. | 257/24 |

OTHER PUBLICATIONS

Patent Abstracts of Japan, Publication No. 2008-293409, Publication Date Dec. 4, 2008.

\* cited by examiner

SEMICONDUCTOR INTEGRATED CIRCUIT DEVICE HAVING ENHANCEMENT TYPE NMOS AND DEPRESSION TYPE MOS WITH N-TYPE CHANNEL IMPURITY REGION AND P-TYPE IMPURITY LAYER UNDER N-TYPE CHANNEL IMPURITY REGION

BACKGROUND OF THE INVENTION

1. Field of the Invention

The present invention relates to an analog semiconductor integrated circuit device which is required to have a high output voltage accuracy.

2. Description of the Related Art

In a semiconductor integrated circuit, a constant voltage circuit which outputs a constant voltage irrespective of the power supply voltage can be realized in a simplified manner at a low cost by, as illustrated in FIGS. 2A and 2B, connecting in series an enhancement type N-channel MOS field effect transistor (hereinafter referred to as NMOS) and a depression type N-channel MOS field effect transistor. Thus, the constant voltage circuit of this type is widely adopted.

In FIG. 2A, in an enhancement type NMOS 101, a source terminal and a body terminal which is connected to a P-type well region (hereinafter referred to as P-well) are connected to a ground terminal at the lowest potential in the constant voltage circuit, while a gate terminal and a drain terminal are connected to a source terminal of a depression type NMOS 102.

Further, in the depression type NMOS 102, a drain terminal is connected to a power supply voltage terminal at the highest potential in the constant voltage circuit, while a gate terminal is connected to the source terminal of the NMOS 102.

When such connection is made, first, the NMOS 101 operates in saturation because the potential of the gate terminal and the potential of the drain terminal are the same. With regard to the NMOS 102, when a voltage of a certain level or higher is applied to the drain terminal, the NMOS 102 operates in saturation. Because currents which pass through the respective NMOSs are the same, the following simple relational expression which expresses a state in which the saturation currents are balanced with each other is obtained:

$$Kne(Vg1-Vtne)^2 = Knd(Vg2-Vtnd)^2, \quad \text{Eq. (a)}$$

where Kne, Vg1, and Vtne are the transconductance, the gate potential, and the threshold voltage of the NMOS 101, respectively, and Knd, Vg2, and Vtnd are the transconductance, the gate potential, and the threshold voltage of the NMOS 102, respectively.

From the above relational expression, an output value Vout of the constant voltage circuit is as follows:

$$Vout = (Knd/Kne)^{1/2} \cdot |Vtnd| + Vtne. \quad \text{Eq. (b)}$$

As expressed above, Vout can be adjusted by the element characteristics of the respective NMOSs. In the case illustrated in FIGS. 2A and 2B, however, Vtnd and Knd are the threshold voltage and the transconductance determined under the back bias effect caused by the voltage Vout since the potential of the body terminal of the NMOS 102 is lower than the potential of the source terminal. To prevent the change in characteristics due to the back bias effect the body terminal will be connected to the source terminal. In this case, in order that the potentials of the respective P-well regions on which the NMOSs 101 and 102 are formed can be changed, it is necessary to select an N-type substrate as the semiconductor substrate to form the P-well regions each isolated by PN junction, and form the NMOSs 101 and 102 on the P-well regions, respectively. Except such case as mentioned above the circuit structure illustrated in FIGS. 2A and 2B is irrelevant to the polarity of the semiconductor substrate and is highly versatile.

Next, a method of manufacturing the above-mentioned conventional semiconductor integrated circuit device is schematically described with reference to FIG. 4. In the description, the same terminology is used as in FIGS. 2A and 2B.

First, a P-type semiconductor substrate or an N-type semiconductor substrate is prepared. After P-type impurities of boron (B) or $BF_2$ are injected by ion implantation into desired regions in which the NMOSs are to be formed, thermal diffusion is performed to form the P-well regions (Step a). The amount of the injected impurities and the conditions of the thermal diffusion are selected so that the impurity concentration in the P-well regions lies between $1\times10^{16}$ cm$^{-3}$ and $1\times10^{17}$ cm$^{-3}$ and the depth of the P-well regions is several micrometers.

Next, in order to electrically isolate the elements from each other, LOCOS or the like is used to form an element isolation region (Step b).

Next, in order to adjust the threshold voltage of the enhancement type NMOS to be a desired value, P-type impurities of boron (B) or $BF_2$ are injected by ion implantation into the region in which the enhancement type NMOS is to be formed (Step c).

Next, in order to adjust the threshold voltage of the depression type NMOS to be a desired value, N-type impurities of phosphorus (P) or arsenic (As) are injected by ion implantation into the region in which the depression type NMOS is to be formed (Step d).

Next, a gate oxide film of the enhancement type NMOS and the depression type NMOS is formed by thermal oxidation (Step e).

Next, in order to form gate electrodes of the enhancement type NMOS and the depression type NMOS, a poly-Si film is deposited and impurities at a high concentration are injected so as to attain $1\times10^{19}$ cm$^{-3}$ or higher by ion implantation or thermal diffusion, and patterning is carried out (Step f).

Next, in order to form source/drain regions and regions for giving potentials of P-well regions (referred to as body regions) under channels of the enhancement type NMOS and the depression type NMOS, impurities are injected by ion implantation. In this case, N-type high concentration impurities for forming the source/drain have a concentration $1\times10^{19}$ cm$^{-3}$ or higher and are arranged at a predetermined distance from the end of the gate electrode. On the other hand, N-type low concentration impurity regions of $5\times10^{16}$ cm$^{-3}$ to $5\times10^{17}$ cm$^{-3}$ are formed from the N-type high concentration impurity regions to the ends of the gate electrode, respectively. The N-type low concentration impurity regions operate to alleviate the electric field when a high voltage is applied (Step g).

Next, an insulating film which is an oxide film is deposited on the entire surface. After contact holes are formed at predetermined locations, in order to give potentials of the gates, sources, drains, and bodies of the respective NMOS elements, metal wiring is formed by sputtering and patterning a metal film (Step h).

Another exemplary conventional constant voltage circuit is described with reference to FIGS. 3A and 3B. In FIGS. 3A and 3B, the same NMOS element as illustrated in FIGS. 2A and 2B is used, and only the wiring method is changed. Specifically, a change is made so that the gate terminal of the depression type NMOS 102 is connected to the ground terminal which is the lowest potential in the constant voltage circuit. Because the gate voltage of the depression type NMOS 102 is shifted to a negative side by Vout, the output voltage and the current consumption can be remarkably reduced. The system of the above-mentioned constant voltage circuit is disclosed in, for example, Japanese Patent Application Laid-open No. 2008-293409.

When a conventional packaging is performed for encapsulating the above-mentioned semiconductor integrated circuit device including a low voltage circuit in a resin package, the following problem arises.

For example, when the threshold voltages and the transconductances of the enhancement type NMOS and the depression type NMOS vary in mass production, the output voltage of the constant voltage circuit varies. Further, the output voltage also fluctuates when the environment such as the temperature fluctuates. Accordingly, a method of realizing an NMOS element structure or a semiconductor integrated circuit system which can reduce fluctuations in output voltage of a constant voltage circuit is desired.

SUMMARY OF THE INVENTION

In order to solve such a problem, according to one embodiment of the present invention, a semiconductor integrated circuit device includes an enhancement type first N-channel type MOS transistor and a depression type second N-channel type MOS transistor, the first NMOS being formed on a P-type well region, having a gate oxide film, a gate electrode, and source and drain regions each of which includes an N-type low concentration region and an N-type high concentration region, and having a positive threshold voltage, the second NMOS being formed on a P-type well region, having a gate oxide film, a gate electrode, source and drain regions each of which includes an N-type low concentration region and an N-type high concentration region, and an N-type channel impurity region, and having a negative threshold voltage. A gate terminal connected to the gate electrode and a drain terminal connected to the drain region of the first NMOS are connected to a source terminal connected to the source region and a gate terminal of the second NMOS. A source terminal and a body terminal connected to the P-type well region of the first NMOS are connected to a ground potential which is the lowest potential in a circuit, a drain terminal of the second NMOS is connected to a power supply voltage which is the highest potential in the circuit, and a body terminal of the second NMOS is connected to the ground potential. The impurity concentration of the P-type well region on which the second NMOS is arranged is higher than the impurity concentration of the P-type well region on which the first NMOS is arranged.

According to another embodiment of the present invention, a semiconductor integrated circuit device includes an enhancement type first N-channel type MOS transistor and a depression type second N-channel type MOS transistor, the first NMOS being formed on a P-type well region, having a gate oxide film, a gate electrode, and source and drain regions each of which includes an N-type low concentration region and an N-type high concentration region, and having a positive threshold voltage, the second NMOS being formed on a P-type well region, having a gate oxide film, a gate electrode, source and drain regions each of which includes an N-type low concentration region and an N-type high concentration region, and an N-type channel impurity region, and having a negative threshold voltage. A gate terminal connected to the gate electrode and a drain terminal connected to the drain region of the first NMOS are connected to a source terminal connected to the source region of the second NMOS. A source terminal and a body terminal connected to the P-type well region of the first NMOS are connected to a ground potential which is the lowest potential in a circuit, a drain terminal of the second NMOS is connected to a power supply voltage which is the highest potential in the circuit, and a gate terminal and a body terminal of the second NMOS are connected to the ground potential. The impurity concentration of the P-type well region on which the second NMOS is arranged is higher than the impurity concentration of the P-type well region on which the first NMOS is arranged.

In the semiconductor integrated circuit device, the impurity concentration of the P-type well region on which the first NMOS is arranged is lower than $1 \times 10^{17}/cm^3$ and the impurity concentration of the P-type well region on which the second NMOS is arranged is higher than $1 \times 10^{17}/cm^3$.

Alternatively, in the semiconductor integrated circuit device, the P-type well regions of the first and second NMOSs have the same impurity concentration, but a P-type impurity layer having a partly higher impurity concentration than that of the P-type well region is provided under the N-type channel impurity region of the second NMOS.

Further, in the semiconductor integrated circuit device, the impurity concentration of the P-type well region on which the first NMOS is arranged is lower than $1 \times 10^{17}/cm^3$ and the impurity concentration of the P-type impurity layer having a partly higher impurity concentration than that of the P-type well region under the N-type channel impurity region of the second NMOS is higher than $1 \times 10^{17}/cm^3$.

Alternatively, in the semiconductor integrated circuit device, each of the source/drain regions of the second NMOS includes an N-type low concentration region in proximity to the gate electrode and an N-type high concentration region which is formed under a contact hole and in contact with the N-type low concentration region, and the length of the N-type low concentration region in the source region from an end of the gate electrode to the N-type high concentration region is larger than the length of the N-type low concentration region in the drain region from another end of the gate electrode to the N-type high concentration region.

According to the present invention, a highly accurate analog semiconductor integrated circuit device can be provided which can inhibit fluctuations in output voltage of a constant voltage circuit.

DETAILED DESCRIPTION OF THE PREFERRED EMBODIMENTS

Figure 1:
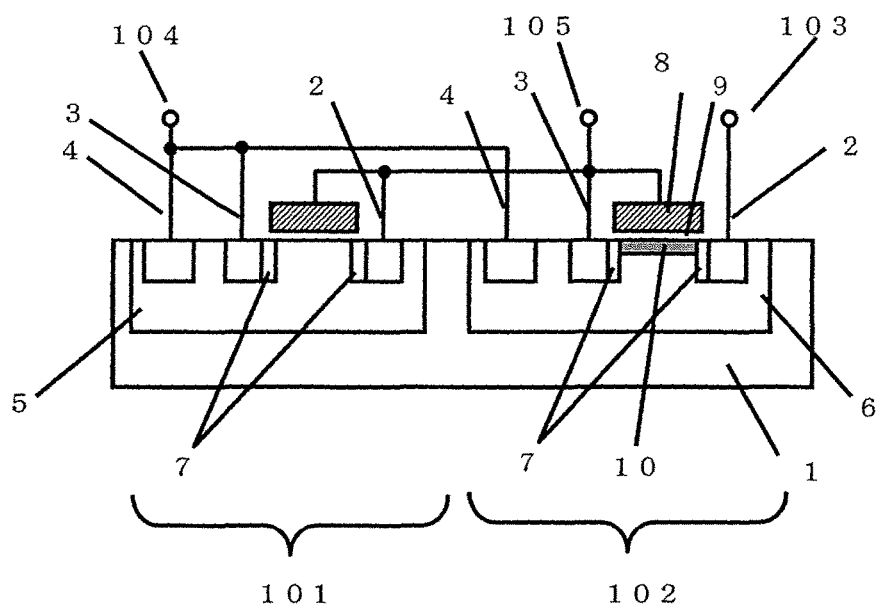
FIG. 1 is a schematic sectional view of a semiconductor integrated circuit device according to a first embodiment of the present invention.

Embodiments of the present invention are described in the following with reference to the attached drawings. FIG. 1 is a sectional view of a semiconductor integrated circuit device according to a first embodiment of the present invention, and is an example in which a constant voltage circuit effectively uses a back bias applied to a depression type NMOS.

Figure 2A:
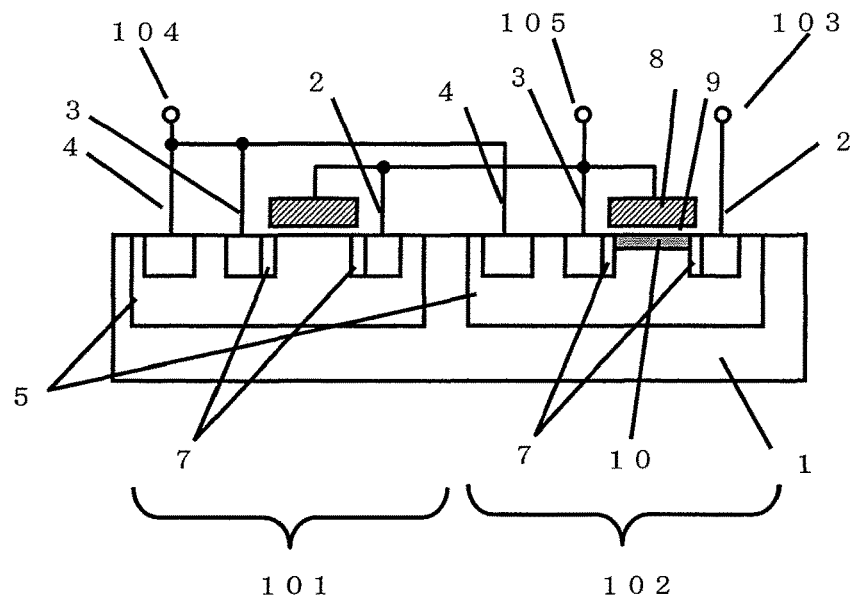
FIG. 2A is a schematic sectional view of a conventional semiconductor integrated circuit device.
Figure 2B:
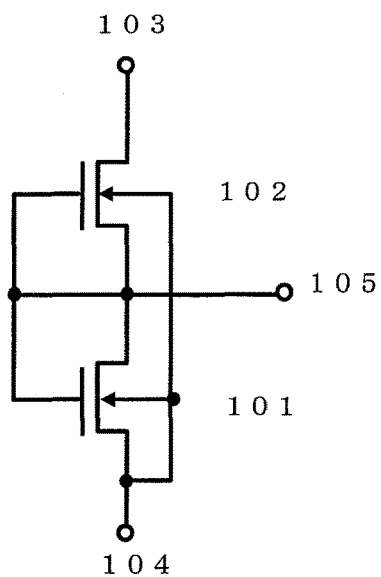
FIG. 2B is a circuit connection diagram of the conventional semiconductor integrated circuit device.

FIG. 1 is a sectional view in which the conventional constant voltage circuit illustrated in FIGS. 2A and 2B has a feature of the present invention added thereto. The difference is that a P-well region on which an enhancement type NMOS 101 is arranged and a P-well region on which a depression type NMOS 102 is arranged are individually formed, and the impurity concentrations of the P-well regions are different from each other. Specifically, the impurity concentration of a P-well region 5 on which the enhancement type NMOS 101 is arranged is $1\times10^{15}/\text{cm}^3$ or higher and lower than $1\times10^{17}/\text{cm}^3$, which is an ordinary concentration, while the impurity concentration of a P-well region 6 on which the depression type NMOS 102 is arranged is a special concentration of $1\times10^{17}/\text{cm}^3$ or higher.

In this manner, an effect of enhancing the back bias effect inherently applied to a body terminal of the depression type NMOS is exerted.

Figure 6:
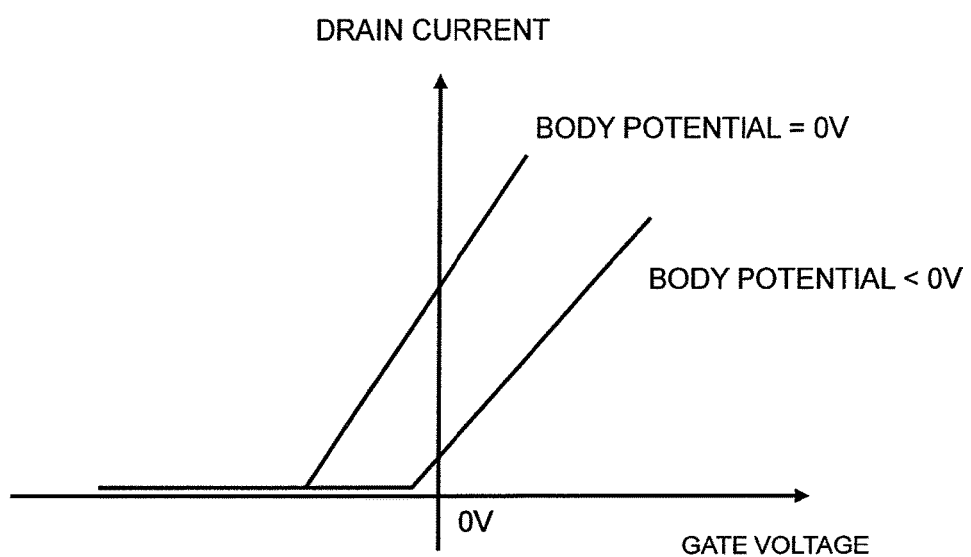
FIG. 6 is a graph showing the relationship between a gate voltage and a drain current in a depression type NMOS transistor.

When a negative back bias is applied to a body terminal of an NMOS, depending on the impurity profile in a channel, the threshold voltage generally shifts to a higher side and the transconductance (corresponding to the slope of the voltage-current characteristics shown in FIG. 6) generally shifts to a lower side.

This effect becomes more remarkable as the impurity concentration of the P-well region becomes higher. The reason is as follows. The threshold voltage becomes higher by an amount corresponding to the gate voltage necessary for keeping the balance with charge in a depletion layer under the gate which is caused when the back bias is applied. Because an increase in the impurity concentration of the P-well region increases the charge density in the depletion layer, the threshold voltage becomes further, higher. Further, in that case, because the electric field becomes stronger in a direction perpendicular to a current in a plane direction through the channel, the carrier mobility is lowered to lower the transconductance.

Such an effect is considered with regard to the semiconductor integrated circuit device illustrated in FIG. 1. For example, in Eq. (b), when Vtne changes for some reason, in a conventional case, the output voltage changes in accordance with the change in Vtne. However, due to the back bias effect, the following feedback remarkably acts so as to inhibit the change in Vout to inhibit the fluctuations. In this embodiment, because the impurity concentration of the P-well region on which the depression type NMOS is arranged is higher, the following effect becomes more remarkable. A similar effect acts with regard to change in Kne, Vtnd, and Knd.

increase (decrease) in Vtne
→increase (decrease) in Vout
→increase (decrease) in Vtnd/decrease (increase) in Knd due to the back bias effect
→decrease (increase) in Vout Further, a similar effect can be obtained when these element characteristics are changed by external factors such as temperature, and the output voltage of the constant voltage circuit can be very stable.

Figure 5:
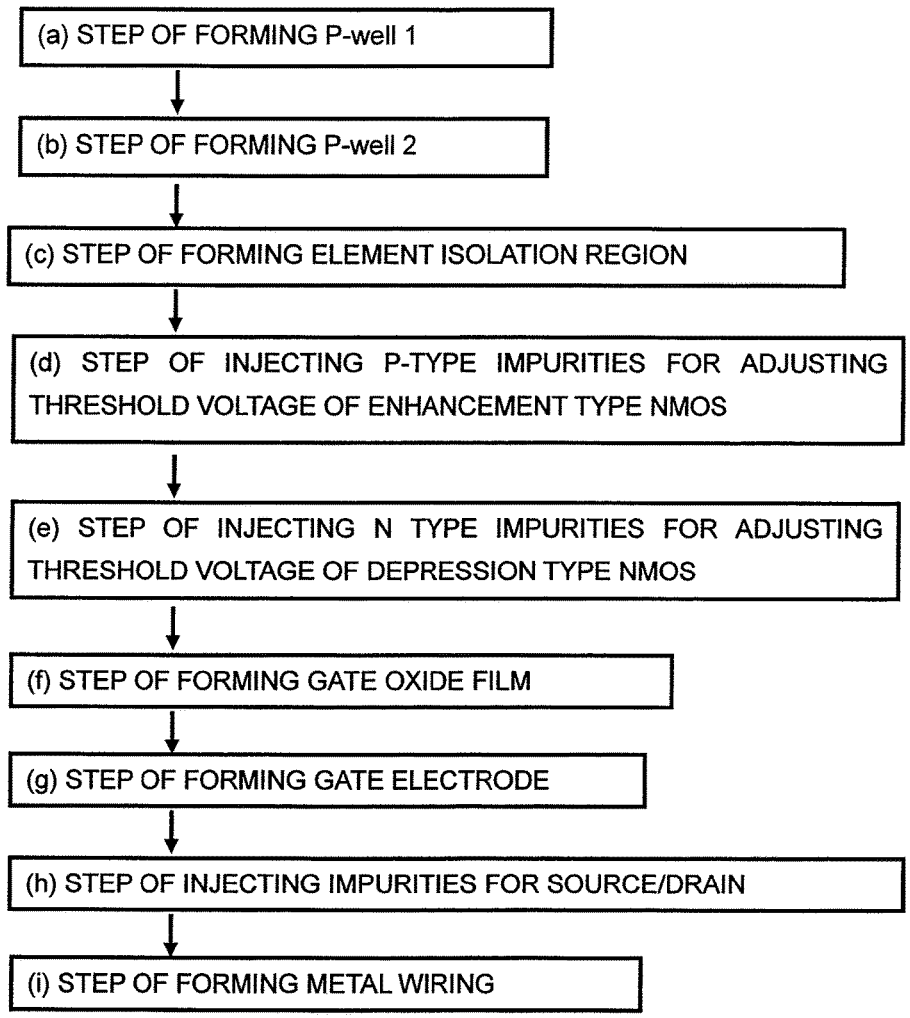
FIG. 5 is a process flow chart for manufacturing the semiconductor integrated circuit device according to the first embodiment of the present invention.

Next, a method of manufacturing the semiconductor integrated circuit device of this embodiment is schematically described with reference to FIG. 5. In the description, like reference numerals are used to designate like members in FIG. 1.

First, a P-type semiconductor substrate or an N-type semiconductor substrate 1 is prepared. After P-type impurities of boron (B) or $BF_2$ are injected by ion implantation into desired regions in which the NMOSs are to be formed, thermal diffusion is performed to form the P-well regions (5 and 6) having different impurity concentrations from each other (Steps a and b). The amounts of the injected impurities and the conditions of the thermal diffusion are selected so that the impurity concentration in the P-well region 5 is $1\times10^{16}$ cm$^{-3}$ or higher and lower than $1\times10^{17}$ cm$^{-3}$, the impurity concentration in the P-well region 6 is $1\times10^{17}$ cm$^{-3}$ or higher, and the depths of the P-well regions 5 and 6 are several micrometers.

Next, in order to electrically isolate the elements from each other, LOCOS or the like is used to form an element isolation region (Step c).

Next, in order to adjust the threshold voltage of the enhancement type NMOS to be a desired value, P-type impurities of boron (B) or $BF_2$ are injected by ion implantation into the region in which the enhancement type NMOS is to be formed (Step d).

Next, in order to adjust the threshold voltage of the depression type NMOS to be a desired value, N-type impurities of phosphorus (P) or arsenic (As) are injected by ion implantation into the region in which the depression type NMOS is to be formed to form an N-type channel impurity region 10 (Step e).

Next, a gate oxide film 9 of the enhancement type NMOS and the depression type NMOS is formed by thermal oxidation (Step f).

Next, in order to form gate electrodes 8 of the enhancement type NMOS and the depression type NMOS, a poly-Si film is deposited and impurities at a high concentration are injected so as to attain $1\times10^{19}$ cm$^{-3}$ or higher by ion implantation or thermal diffusion, and patterning is carried out (Step g).

Next, in order to form source/drain regions 7 and regions for giving potentials of P-well regions (referred to as body regions) under channels of the enhancement type NMOS and the depression type NMOS, impurities are injected by ion implantation. In this case, N-type high concentration impurities for forming the source/drain are injected at a concentration so as to attain $1\times10^{19}$ cm$^{-3}$ or higher at a predetermined distance from ends of the gate electrode. On the other hand, N-type low concentration impurity regions of $5\times10^{16}$ cm$^{-3}$ to $5\times10^{17}$ cm$^{-3}$ are formed from the high concentration source impurity regions to the ends of the gate electrode, respectively. The N-type low concentration impurity regions function to alleviate the electric field when a high voltage is applied (Step h).

Next, an insulating film which is an oxide film is deposited on the entire surface. After contact holes are formed at predetermined locations, in order to give potentials of the gates, sources, drains, and bodies of the respective NMOS elements, metal wiring (2 to 4) is formed by sputtering and patterning a metal film (Step i).

Figure 3A:
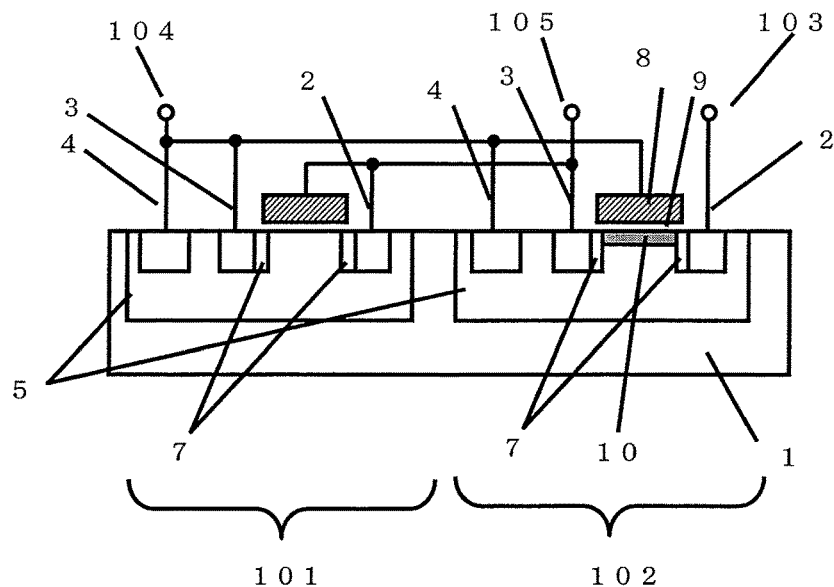
FIG. 3A is a schematic sectional view of another conventional semiconductor integrated circuit device.
Figure 3B:
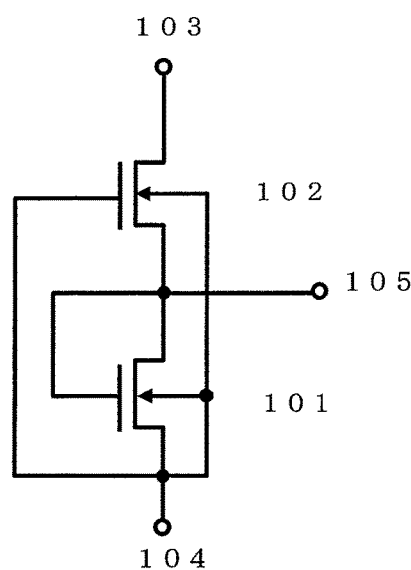
FIG. 3B is a circuit connection diagram of the conventional semiconductor integrated circuit device.
Figure 7:
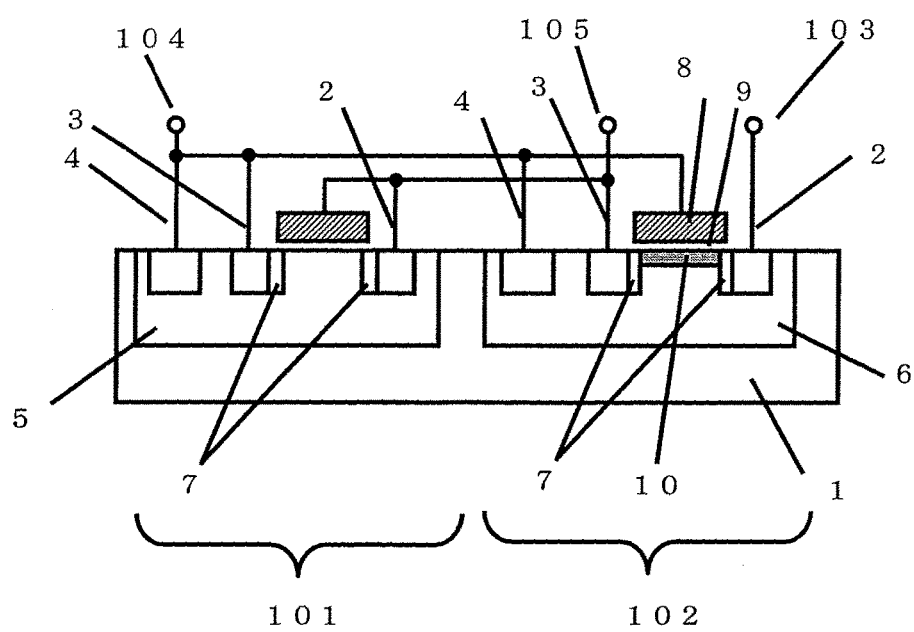
FIG. 7 is a schematic sectional view of another semiconductor integrated circuit device according to the first embodiment of the present invention.

In FIG. 7, the gate terminal of the depression type NMOS 102 in FIG. 1 is connected to a VSS terminal 104, and the semiconductor integrated circuit device in FIG. 7 corresponds to the conventional semiconductor integrated circuit device illustrated in FIGS. 3A and 3B. In FIG. 7, because the gate potential of the depression type NMOS is linked with increase or decrease in output voltage, feedback acts so as to inhibit fluctuations in output voltage. In addition, the feedback due to the back bias effect described above with reference to FIG. 1 acts. In this way, a more stable output potential can be realized.

Figure 8:
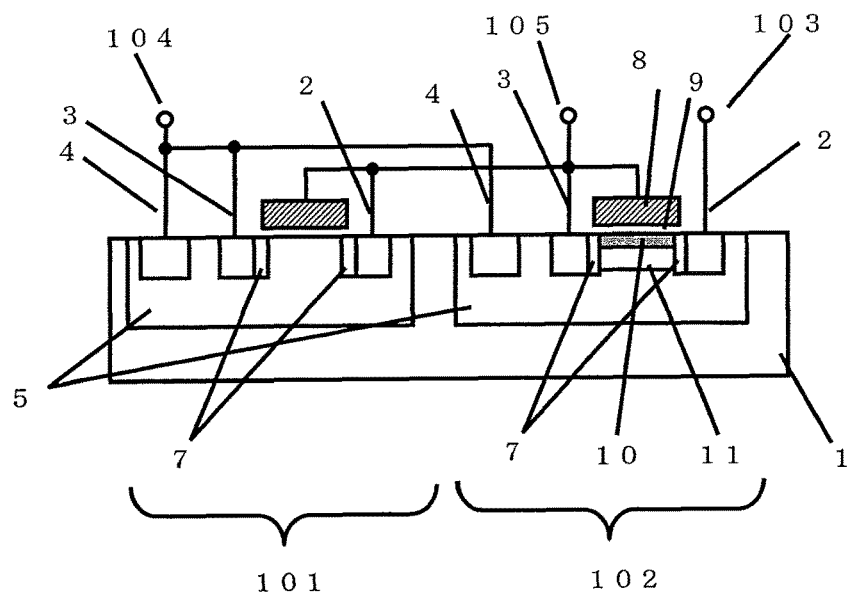
FIG. 8 is a schematic sectional view of a semiconductor integrated circuit device according to a second embodiment of the present invention.

FIG. 8 illustrates a second embodiment for realizing the back bias effect as described with reference to FIG. 1. In FIG. 8, as in a conventional case, the enhancement type NMOS 101 and the depression type NMOS 102 have the same P-well region 5, but a P-type channel impurity region 11 having the impurity concentration higher than that of the P-well region is locally formed immediately below the N-type channel impurity region 10 of the depression type NMOS 102. Such a structure enables the depression type NMOS 102 to obtain a sufficient back bias effect similarly to the case illustrated in FIG. 1, and the stability of the output voltage of the constant voltage circuit can be improved.

Figure 9:
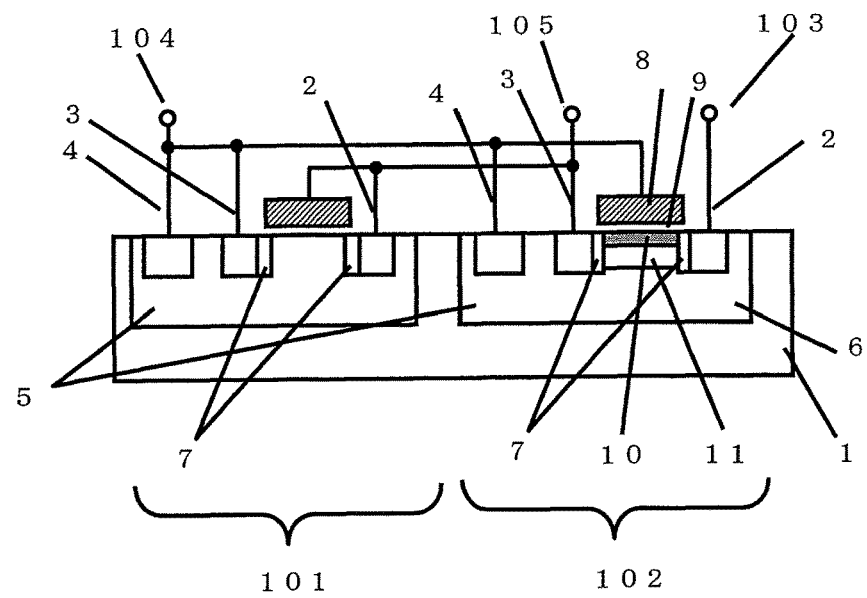
FIG. 9 is a schematic sectional view of another semiconductor integrated circuit device according to the second embodiment of the present invention.

In FIG. 9, the gate terminal of the depression type NMOS 102 illustrated in FIG. 8 is connected to a VSS terminal 103. In addition to the feedback due to the gate potential of the depression type NMOS, the feedback due to the back bias effect according to the present invention acts, and a more stable output potential can be realized.

Figure 4:
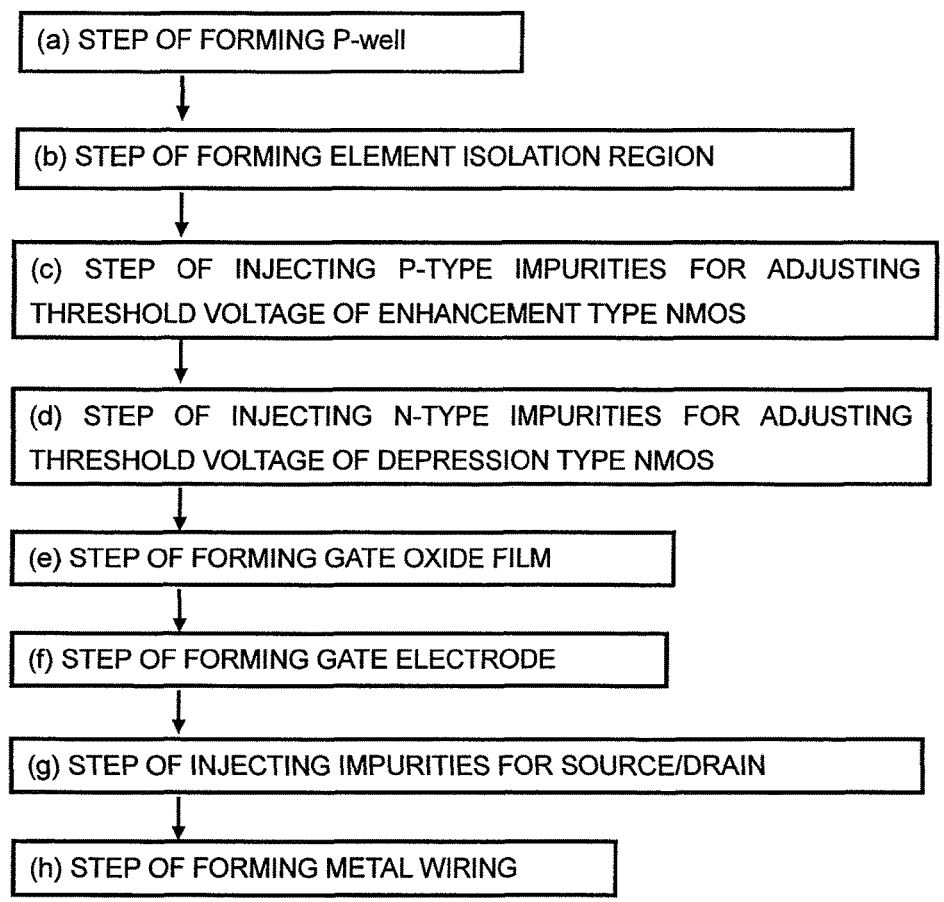
FIG. 4 is a process flow chart for manufacturing the conventional semiconductor integrated circuit device.
Figure 10:
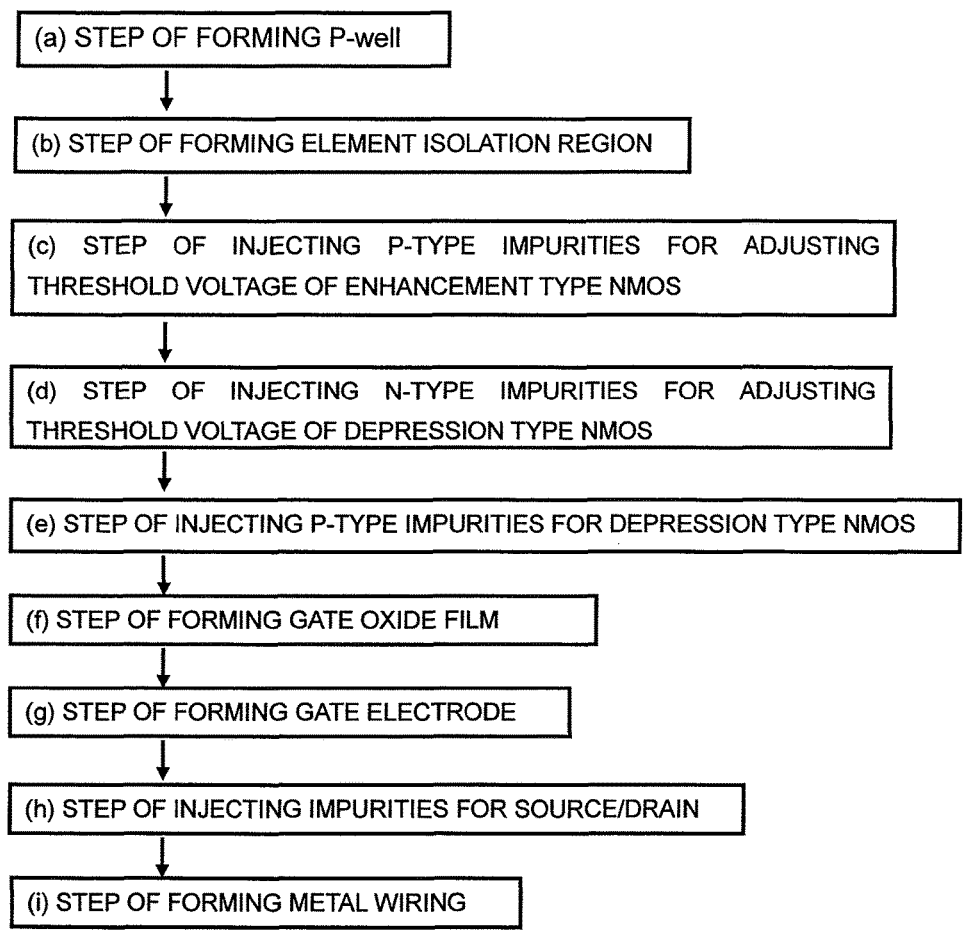
FIG. 10 is a process flow chart for manufacturing the semiconductor integrated circuit device according to the second embodiment of the present invention.

FIG. 10 schematically illustrates semiconductor manufacturing steps of the second embodiment. In this embodiment, after the step of injecting N-type impurities for the depression type NMOS 102 for adjusting the threshold voltage illustrated in FIG. 4 in the conventional case, a step (e) of injecting P-type impurities such as boron (B) or BF$_2$ for the depression type NMOS is added. In this case, the P-type impurity region is formed by ion implantation, and the energy for the step is selected so that, in terms of injection depth, the impurity concentration becomes the highest immediately below the N-type channel impurity region.

By carrying out this step as the same mask step as the step of injecting the N-type impurities prior to the step, the number of the mask steps is prevented from being increased. Because it is not necessary to prepare a mask for forming the P-well region dedicated to the depression type NMOS as in the first embodiment, there is an advantage over the case of the first embodiment in that the manufacturing steps can be reduced to realize cost reduction.

Figure 11:
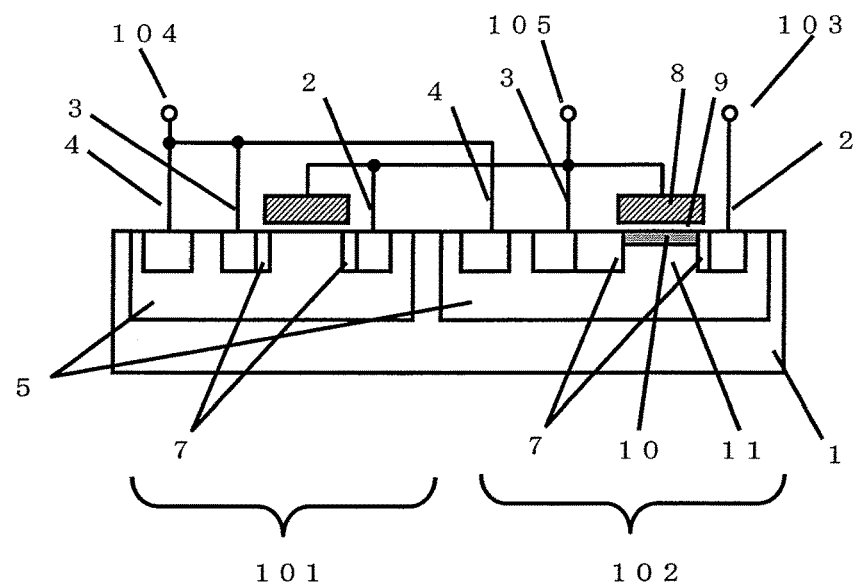
FIG. 11 is a schematic sectional view of a semiconductor integrated circuit device according to a third embodiment of the present invention.

FIG. 11 illustrates a third embodiment of the present invention in which the back bias effect as described with reference to FIG. 1 is obtained by another method. In FIG. 11, with regard to the N-type low concentration source/drain regions 7 of the depression type NMOS 102, the source side extends longer than the drain side.

Generally, it is preferred that the low concentration source/drain regions be short insofar as no degradation in characteristics is caused. The reason is to reduce the footprint to contribute to cost reduction. However, according to the present invention, from the viewpoint of enhancing the back bias effect, only the length of the N-type low concentration region on the source side of the depression type NMOS 102 is extended to be at the level of several micrometers to several tens of micrometers, while the other N-type low concentration region is at the ordinary level of several micrometers and is caused to be as small as possible. Because this N-type low concentration region has a surface resistivity of several kilo-ohms per square to several tens of kilo-ohms per square, when the depression type NMOS is operated, a drive current of the transistor also passes through this N-type low concentration region, and voltage drop of several hundreds of millivolts to several volts is caused. This voltage drop causes voltage difference between the source terminal and the body terminal in the channel region of the depression type NMOS for the voltage drop, which is the back bias in the depression type NMOS.

It can be said that this embodiment is a highly versatile method which can be applied to various kinds of semiconductor processes, because, although the necessary area increases, no special semiconductor manufacturing step is added.

Figure 12:
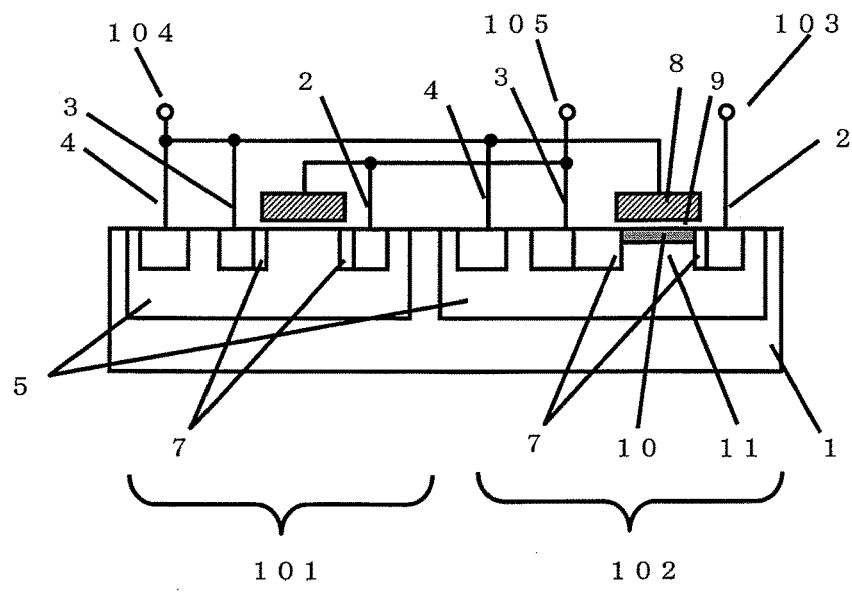
FIG. 12 is a schematic sectional view of another semiconductor integrated circuit device according to the third embodiment of the present invention.

In FIG. 12, the gate terminal of the depression type NMOS 102 illustrated in FIG. 11 is connected to the VSS terminal 103. In addition to the feedback due to the gate potential of the depression type NMOS, the feedback due to the back bias effect according to the present invention acts, and a more stable output potential can be realized.

It goes without saying that the first to third embodiments described above are not independent of one another and an appropriate combination thereof can enhance the effect. Although not illustrated, for example, in the depression type NMOS, the impurity concentration of the P-well region can be set to be higher and a P-type high concentration impurity region can be formed under the N-type channel impurity region at the same time. Further, by setting the impurity concentration of the P-well region to be higher and providing the P-type channel impurity region, and in addition, extending the N-type low concentration region on the source side at the same time, the back bias effect can be enhanced to further improve the stability of the output voltage of the constant voltage circuit.

What is claimed is:

1. A semiconductor integrated circuit device, comprising:
an enhancement type first N-channel type MOS transistor having a positive threshold voltage, the first N-channel type MOS transistor comprising:
a first gate oxide film formed on a first P-type well region;
a first gate electrode;
a first gate terminal connected to the first gate electrode;
a first source region and a first drain region, each of which comprises an N-type low concentration region and an N-type high concentration region;
a first drain terminal connected to the first drain region;

a first source terminal connected to the first source region; and a first body terminal connected to the first P-type well region; and a depression type second N-channel type MOS transistor having a negative threshold voltage, the second N-channel type MOS transistor comprising:

a second gate oxide film formed on a second P-type well region;

a second gate electrode;

a second gate terminal connected to the second gate electrode;

a second source region and a second drain region, each of which comprises an N-type low concentration region and an N-type high concentration region;

a second drain terminal connected to the second drain region;

a second source terminal connected to the second source region;

a second body terminal connected to the second P-type well region; and an N-type channel impurity region;

wherein the first gate terminal and the first drain terminal are connected to the second source terminal and the second gate terminal, wherein the first source terminal and the first body terminal are connected to a ground potential which is a lowest potential in a circuit, wherein the second drain terminal is connected to a power supply voltage which is a highest potential in the circuit, wherein the second body terminal is connected to the ground potential, wherein the second P-type well region is formed apart from the first P-type well region and has an impurity concentration higher than an impurity concentration of the first P-type well region, the N-type channel impurity region being formed in the second P-type well region;

wherein each of the second source region and the second drain region comprises the N-type low concentration region in proximity to the second gate electrode and the N-type high concentration region provided in contact with the N-type low concentration region; and wherein a length of the N-type low concentration region in the second source region from an end of the second gate electrode to the N-type high concentration region is larger than a length of the N-type low concentration region in the second drain region from another end of the second gate electrode to the N-type high concentration region, and only the length of the N-type low concentration region in the second source region is longer than that of the first source region, the first drain region and the second drain region.

2. A semiconductor integrated circuit device, comprising:

an enhancement type first N-channel type MOS transistor having a positive threshold voltage, the first N-channel type MOS transistor comprising:

a first gate oxide film formed on a first P-type well region;

a first gate electrode;

a first gate terminal connected to the first gate electrode;

a first source region and a first drain region, each of which comprises an N-type low concentration region and an N-type high concentration region;

a first drain terminal connected to the first drain region;

a first source terminal connected to the first source region; and a first body terminal connected to the first P-type well region; and a depression type second N-channel type MOS transistor having a negative threshold voltage, the second N-channel type MOS transistor comprising:

a second gate oxide film formed on a second P-type well region;

a second gate electrode;

a second gate terminal connected to the second gate electrode;

a second source region and a second drain region, each of which comprises an N-type low concentration region and an N-type high concentration region;

a second drain terminal connected to the second drain region;

a second source terminal connected to the second source region;

a second body terminal connected to the second P-type well region; and an N-type channel impurity region;

wherein the first gate terminal and the first drain terminal are connected to the second source terminal, wherein the first source terminal and the second body terminal are connected to a ground potential which is a lowest potential in a circuit, wherein the second drain terminal is connected to a power supply voltage which is a highest potential in the circuit, wherein the second gate terminal and the second body terminal are connected to the ground potential, wherein the second P-type well region is formed apart from the first P-type well region and has an impurity concentration higher than an impurity concentration of the first P-type well region, the N-type channel impurity region being formed in the second P-type well region;

wherein each of the second source region and the second drain region comprises the N-type low concentration region in proximity to the second gate electrode and the N-type high concentration region provided in contact with the N-type low concentration region; and wherein a length of the N-type low concentration region in the second source region from an end of the second gate electrode to the N-type high concentration region is larger than a length of the N-type low concentration region in the second drain region from another end of the second gate electrode to the N-type high concentration region, and only the length of the N-type low concentration region in the second source region is longer than that of the first source region, the first drain region and the second drain region.

* * * * *